United States Patent [19]
Retz et al.

[11] Patent Number: 5,884,489
[45] Date of Patent: Mar. 23, 1999

[54] SUPERCONDUCTING MAGNETS

[75] Inventors: Patrick William Retz, Eynsham; Keith White, Cassington, both of England

[73] Assignee: Oxford Magnet Technology Limited, England

[21] Appl. No.: 744,340

[22] Filed: Nov. 7, 1996

[30] Foreign Application Priority Data

Nov. 8, 1995 [GB] United Kingdom .................. 9522830

[51] Int. Cl.$^6$ .................................................. F25B 19/00
[52] U.S. Cl. ........................................... 62/51.1; 335/216
[58] Field of Search .............................. 62/51.1; 335/216

[56] References Cited

U.S. PATENT DOCUMENTS

| | | | |
|---|---|---|---|
| 4,516,404 | 5/1985 | Laskaris | 62/51.1 |
| 4,522,034 | 6/1985 | Laskaris | 62/51.1 |
| 4,526,015 | 7/1985 | Laskaris | 62/51.1 |
| 4,535,596 | 8/1985 | Laskaris | 62/51.1 |
| 4,543,794 | 10/1985 | Matsutani et al. | |
| 4,667,486 | 5/1987 | Miller et al. | 62/51.1 |
| 4,667,487 | 5/1987 | Miller et al. | 62/51.1 |
| 4,713,945 | 12/1987 | Rappaport et al. | 62/51.1 |
| 4,782,671 | 11/1988 | Breneman et al. | 62/51.1 |
| 4,884,409 | 12/1989 | Quack et al. | 62/51.1 |

FOREIGN PATENT DOCUMENTS 0 350 265 A2  4/1989  European Pat. Off. .

OTHER PUBLICATIONS

IEEE "Transactions on Magnetics", vol. 24, No. 2, Mar. 1988.
IEEE "Transactions on Magnetics", vol. 21, No. 2, Mar. 1985.
Hitachi Review, Compact Superconducting Magnets for Magnetic Resonance Imaging, vol. 39, 1990 pp. 31–34.

*Primary Examiner*—Ronald Capossela
*Attorney, Agent, or Firm*—Evenson, McKeown, Edwards & Lenahan, P.L.L.C.

[57] ABSTRACT

A super-conducting electro-magnet for use in an MRI system comprising a helium vessel within which magnet windings are positioned, a vacuum chamber within which the helium vessel is contained, at least one thermal shield positioned between the helium vessel and the vacuum chamber in spaced apart relationship, a service turret including a refrigerator thermally coupled to the said at least one shield for cooling purposes, a tube which extends through the turret from the windings to facilitate filling, and conductors which extend through the turret from the windings to facilitate current injection to the windings and to provide a vent for the helium gas.

19 Claims, 5 Drawing Sheets

SUPERCONDUCTING MAGNETS

BACKGROUND OF THE INVENTION

This invention relates to super-conducting electro-magnets for use in magnetic resonance imaging (MRI) apparatus.

Super-conducting electro-magnets for MRI apparatus comprise windings immersed in liquid helium so that they are cooled to temperatures of about 4° K at which they become super-conductors. A helium vessel containing the windings is positioned within a vacuum chamber which serves to reduce heat gain by convection and in order to reduce heat gain by radiation, thermal shields are positioned between the helium vessel and the vacuum chamber. The thermal shields, are usually cooled by a refrigerator which in known apparatus is provided in a refrigerator turret. Such an arrangement is described in European patent specification EP0260036. The refrigerator turret extends into the vacuum chamber to facilitate thermal coupling of the shields to the refrigerator. In order to provide access to the windings for current injection purposes, and access to the helium vessel for filling and topping up purposes, in known apparatus a service turret is additionally provided.

Although generally satisfactory in operation, this known arrangement has the disadvantage that it tends to be expensive to fabricate and time consuming to assemble. It also has the disadvantage that a current probe must be inserted to make electrical contact with a connector in the helium vessel when it is desired to inject current into the windings. The insertion of the current probe is an undesirable operation because the turret must be opened to atmosphere, and air/water vapour from the atmosphere could enter the turret where it would freeze on the cold surfaces, creating a blockage. In addition, inserting the current probe into a magnet which is energised can cause the magnet to quench if insufficient care is taken to cool the probe fully before engagement with the connector on the windings. Magnets with the known service turret may be fitted with permanently connected current leads, but because these are cooled only by gas boiling off from the helium vessel, they impose a considerable heat load onto the helium vessel by virtue of having to have good electrical conductivity (and therefore good thermal conductivity) to connect electrical current to the windings. The reasons for this are well understood by those skilled in the art, and further detailed explanation is therefore believed to be unnecessary.

SUMMARY OF THE INVENTION

It is therefore an object of the present invention to provide an improved magnet arrangement wherein these disadvantages are at least partly obviated.

According to the present invention a super-conducting electromagnet for use in an MRI system comprises a helium vessel within which magnet windings are positioned, a vacuum chamber within which the helium vessel is contained, at least one thermal shield positioned between the helium vessel and the vacuum chamber in spaced apart relationship, a service turret including a refrigerator thermally coupled to the said at least one shield for cooling purposes, a tube which extends through the service turret from the windings to facilitate filling, and conductors which extend through the service turret from the windings to facilitate current injection to the windings.

In a super-conducting magnet according to the present invention the refrigerator, the tube for helium filling and the conductors via which current is fed during start up to the windings, are all contained within one turret and this considerably simplifies construction, reduces construction costs, and simplifies current injection into the windings.

There may be provided in spaced apart relationship two thermal shields positioned one within the other the refrigerator having two stages a first stage of which is thermally coupled to an outer of the two thermal shields and a cooler second stage of which is thermally coupled to an inner of the two thermal shields, the two stages being in a helium environment.

The two shields may be coupled to respective refrigerator stages via flexible thermal links and a pair of annular flanges arranged in spaced apart relationship to support respective stages co-axially within the turret. The thermal links accommodate relative movement of the coupled parts due to thermal contraction during cooldown. The links also reduce the transmission of vibration from the refrigerator to the shields. Vibration of the shields can cause interference on the image produced by the MRI apparatus.

The conductors may comprise two conductors and high temperature super-conducting elements for positive and negative winding connections respectively.

The conductors may themselves be tubular and/or they may be contained within a conduit, which might itself be conductive, via which tubular conductors and/or conduit the helium vessel is vented so that the conductors are effectively helium gas cooled.

The conductors may be arranged to project in thermal contiguity through the flanges but so as to be electrically isolated therefrom. The thermal connection to the flanges fixes the temperature of the conductors near to the temperature of the flanges so that heat flowing down the conductors is removed via the flanges to the refrigerator. In this way the heat conducted to the helium vessel may be reduced to an acceptably low level of, in the region of 10 cc/hr in terms of liquid helium loss, with metallic conductors, which may be fabricated from brass. Further reduction of heat load to the helium vessel may be effected by replacing the section of conductor closest to the helium vessel, (which is the coldest part) with a high temperature super-conductor. This is only possible however, if the section of conductor is adequately cooled by close thermal contact with the flanges which are cooled by the refrigerator.

The conductors are cooled primarily by the connection to the refrigerator when they are not carrying current. When they are carrying current the extra helium gas boiled off from the helium vessel by the electrical current heating load can pass only up the conductors thereby to provide the cooling necessary for safe operation of the conductors which must of necessity be of small cross sectional area so as to keep to a minimum the heat load when they are not carrying current.

The conductors may each be provided with shoulders which are clamped against respective insulative bushes retained within the flanges by means of retaining clamps which are bolted to the flanges with the shoulders and bushes sandwiched therebetween.

The bushes may be fabricated from anodised aluminium so that oxide anodisation provides the required insulation.

A bush in at least one flange may be spaced apart from a shoulder against which it is clamped by means of a deformable Indium spacer washer.

Spaces around the refrigerator within the service turret may be filled or partially filled with thermally insulating material, as may the space between the lower stage of the refrigerator and the helium vessel. This permits operation of the turret at an angle from the vertical without excessive increase of heat loads.

The conductors may be provided at an end thereof remote from the windings with demountable terminal means supported in a turret top plate, whereby removal of the top plate and terminal means for servicing of the refrigerator is facilitated.

The terminal means may comprise insulated 'lead throughs' for terminal conductors, which 'lead throughs' are sealed to prevent air from entering the turret.

Other objects, advantages and novel features of the present invention will become apparent from the following detailed description of the invention when considered in conjunction with the accompanying drawings.

DETAILED DESCRIPTION OF THE DRAWINGS

Figure 1:
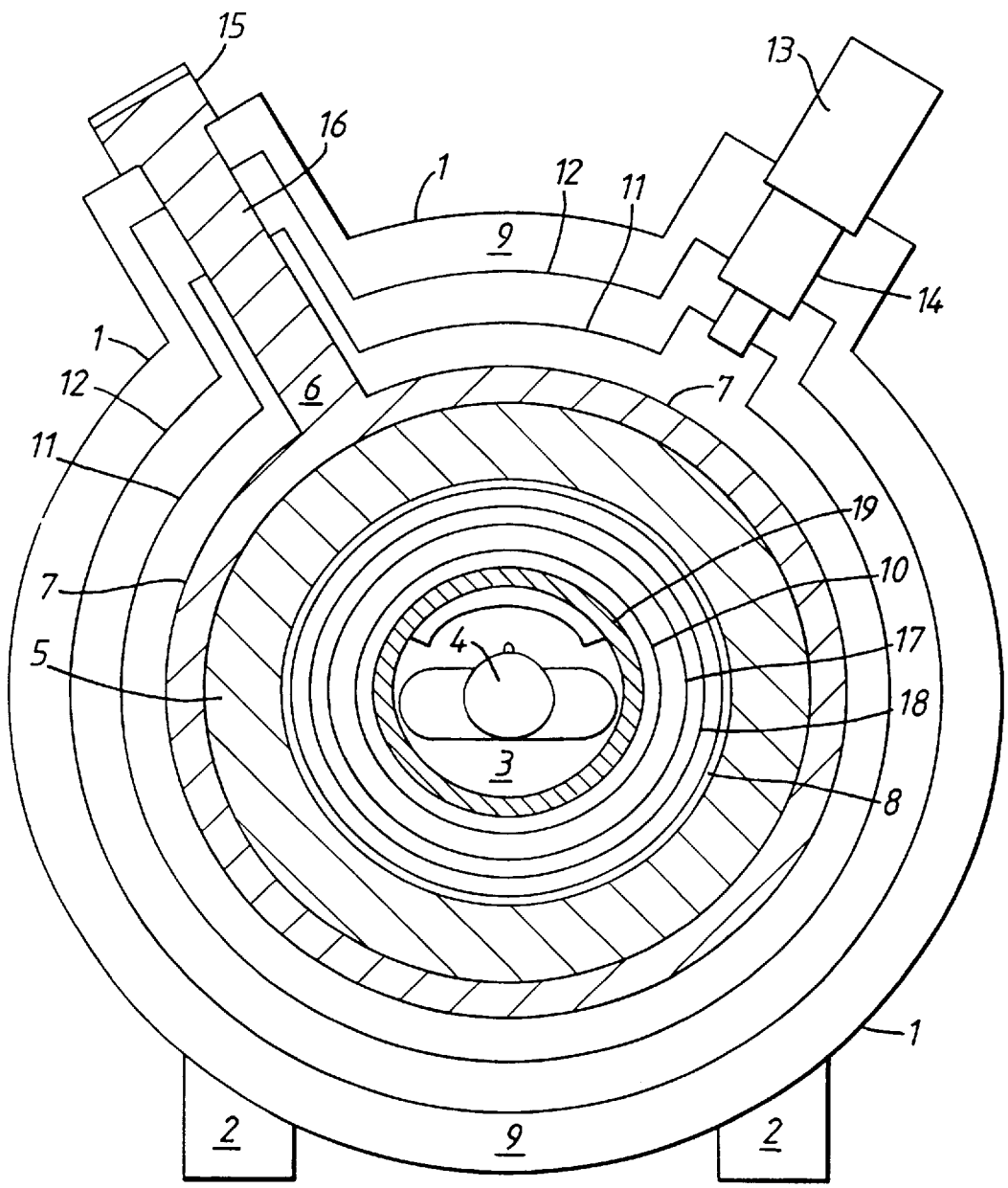
FIG. 1 is a partially schematic sectional end view of a known MRI system including a super-conducting electro-magnet.

Referring now to FIG. 1, a known MRI system comprises a housing 1 supported on feet 2 within which is provided an elongate generally cylindrical space 3, and within which space 3 a patient 4 is supported. Surrounding the space 3 there is provided an electro-magnet including an annular winding 5, the winding 5 being contained within a helium filled vessel 6 having an outer shell 7 and an inner shell 8. In order to reduce heat gain which would cause 'boil off' of liquid helium from the vessel 6, the vessel 6 is contained within a vacuum chamber 9, the outer wall of which is defined by the housing 1 and an inner wall of which comprises a bore tube 10. In order to reduce heat gain by radiation, inner and outer thermal shields 11 and 12 respectively are provided in spaced apart relationship between the outer shell 7 and the housing 1 which defines the outer wall of the vacuum chamber 9.

In order to cool the thermal shields 11 and 12 so as still further to reduce heat gain, a refrigerator 13 is provided having a refrigerator mount or 'unisock' 14 which is arranged to couple the refrigerator 13 to the thermal shields 11 and 12 respectively, whereby cooling is effected.

In order to facilitate filling of the vessel 6 with liquid helium and to provide access to the winding 5 for current injection purposes, a service turret 15 is provided having a neck portion 16 which extends through the thermal shields 11 and 12 and through the outer wall of the housing 1.

In order to fully screen the vessel 6, an outer shield bore tube 17 is provided which is spaced apart from an inner shield bore tube 18, the inner shield bore tube 18 and the outer shield bore tube 17 being extended around each end of the vessel 6 to connect with the shields 11 and 12 respectively thereby to provide complete shielding. Similarly the outer wall of the housing 1 is extended around each end to join with the inner wall 10 of the housing. Similarly, the outer shell 7 of the vessel 6 is extended around each end within the inner thermal shield 18 and 11 to join with the inner shell 8.

As will be appreciated by those skilled in the art, gradient and r.f. coils 19 are provided within the cylindrical space 3 as required for imaging.

The known MRI system just before described with reference to FIG. 1 includes two turrets i.e. the service turret 15 and a further turret within which the refrigerator 13 is mounted. Although this known twin turret arrangement is generally satisfactory in operation, it tends to be expensive to fabricate and time consuming to assemble.

An improved arrangement comprising a single turret will now be described with reference to FIGS. 2, 3, 4 and 5 wherein corresponding parts of the various Figures bear as appropriate the same numerical designations.

Figure 3:
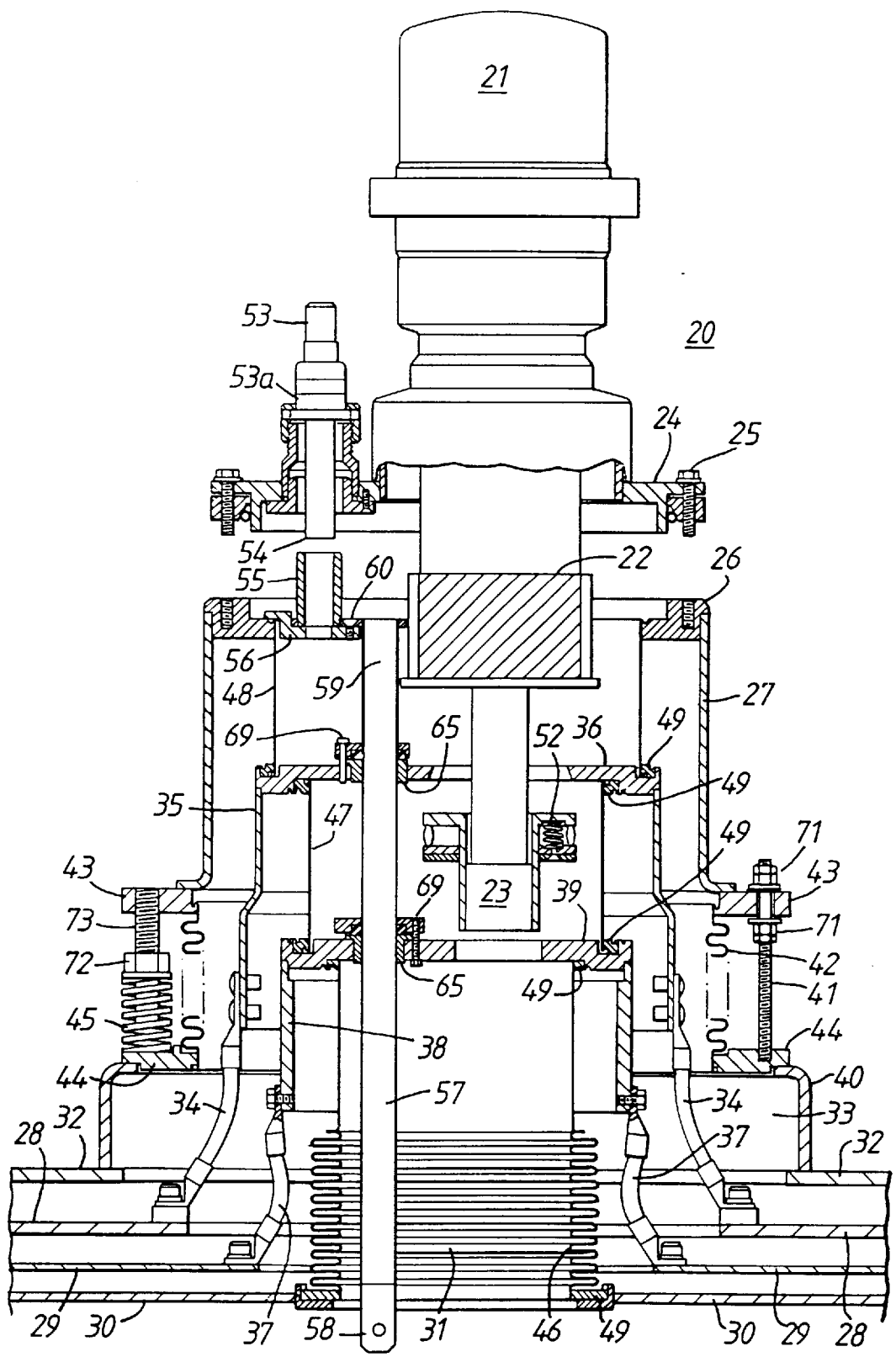
FIG. 3 is a part sectional side view, partly exploded, of the turret shown in FIG. 2 on a line XX.
Figure 4:
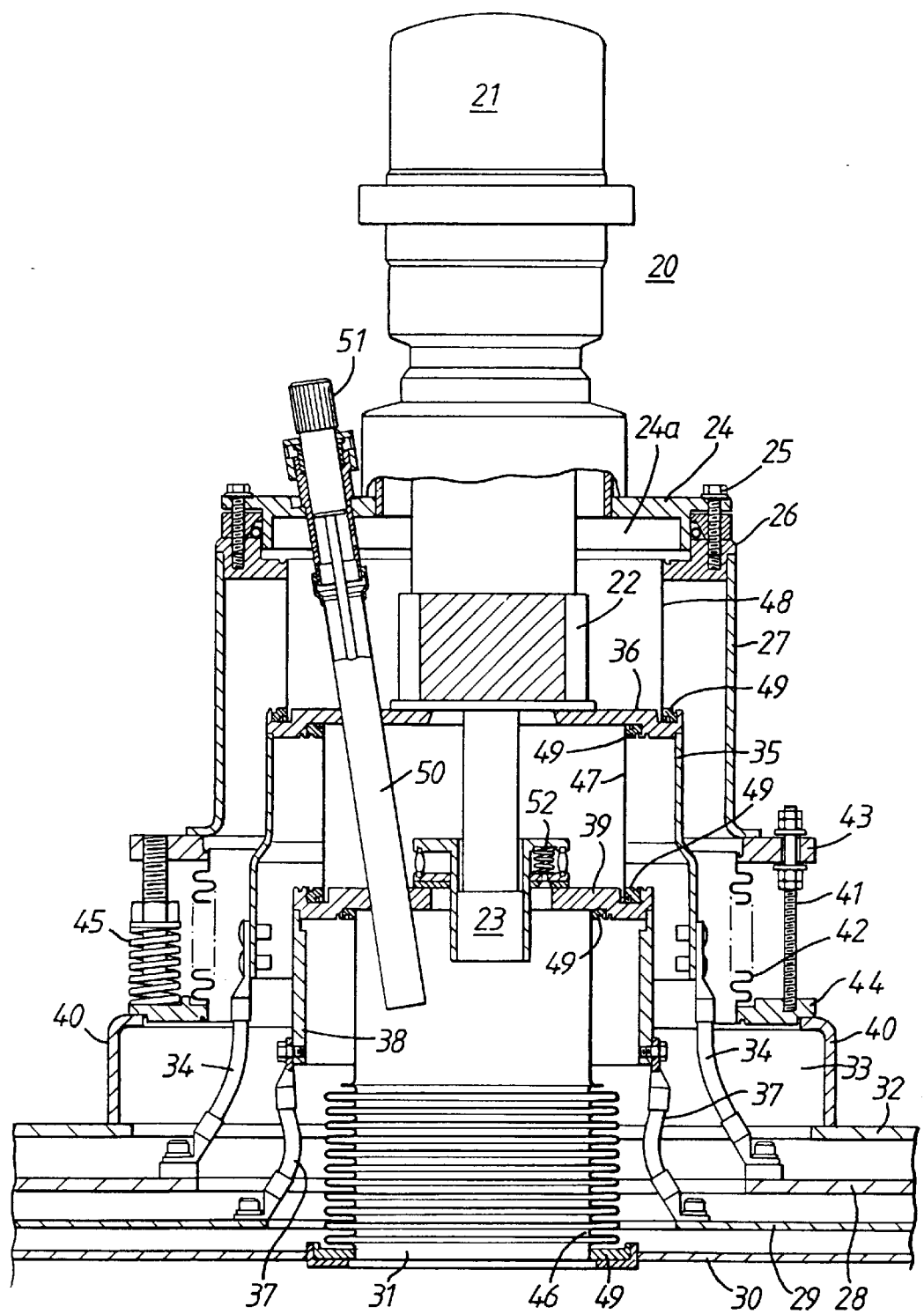
FIG. 4 is a part sectional side view of the turret shown in FIG. 2 on a line YY.
Figure 5:
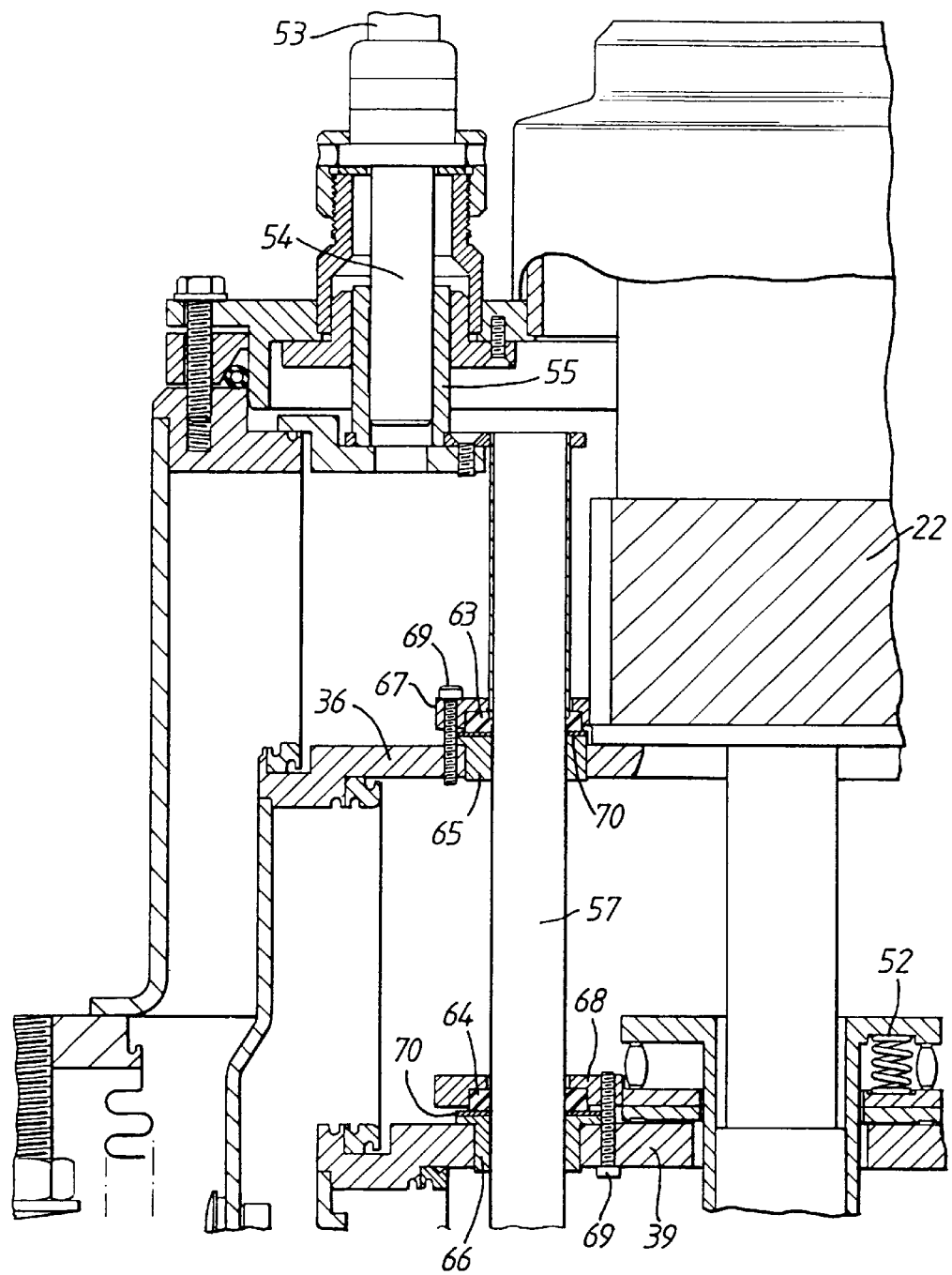
FIG. 5 is an enlarged part sectional side view of parts of the turret shown in FIG. 3 shown in greater detail.

As shown in FIGS. 3 and 4 a turret 20 comprises a refrigerator 21 having first and second stages 22 and 23 respectively. The refrigerator 21 is mounted on a top plate 24 which includes a thermally insulative insert (not shown) and which is bolted by means of bolts 25 to a lip portion 26 of an upper cylindrical wall 27 of the turret 20. The first and second stages 22 and 23 of the refrigerator 21 are used to cool heat shields 28 and 29 respectively which are arranged in spaced apart relationship between a wall 30 of a helium vessel 31 and an outer vacuum chamber wall 32. A space 33 between the walls 30 and 32 is evacuated to limit heat gain by helium contained within the vessel 31 formed by the wall 30, within which vessel 31 magnet windings (not shown) are contained.

The first stage 22 of the refrigerator 21 is thermally coupled to the outer heat shield 28 by a means of a plurality of flexible thermal links 34, a generally cylindrical heat shield 35 and a flange plate 36 on which the first stage 22 of the refrigerator is mounted. Similarly, the second stage 23 of the refrigerator is thermally linked to the inner heat shield 29 by means of a plurality of flexible thermal links 37, a cylindrical heat shield 38 and a flange plate 39 on which the second stage 23 of the refrigerator is mounted. The thermal links accommodates relative movement of the coupled parts due to thermal contraction during cooldown. The links also reduce the transmission of vibration from the refrigerator to the shields. Vibration of the shields can cause interference on the image produced by the MRI apparatus. Spaces above flange plate 36, and between the flange plates 36 and 39, around the refrigerator, are lagged with suitable thermal insulation (not shown) and the underside of the flange 39 is also lagged with insulation (not shown).

The outer vacuum chamber wall 32 is extended by means of a generally cylindrical neck portion 40 which is coupled to the upper cylindrical wall 27 of the turret by means of a flexible bellows link 42 and upper and lower rings 43 and 44. A plurality of threaded rods 41 are mounted in lower ring 44 and extend through clearance holes in upper ring 43. Nuts 71 are movably mounted on rods 41 above and below upper ring 43 and are arranged so as to limit the movement of upper ring 43 but not so as to touch the ring in normal operation.

A plurality of coil springs 45 are seated in the lower ring 44 and threaded rods 73 are mounted in the upper ring 43 which pass through the coil springs but do not touch the lower ring 44. Threaded adjusting nuts 72 on each of rods 73 are adjusted against coil springs 45 to support upper ring 43 against the force of air pressure acting on upper ring 43 so as to maintain upper ring 43 in its correct operating position between movement limiting nuts 71. Similarly the wall 30 of the helium vessel 31, which in effect constitutes the inner wall of the vacuum chamber space 33, is flexibly secured by means of a bellows arrangement 46 to the flange 39, the vacuum chamber space 33 being extended between the flange 39 and the flange 36 by means of a cylindrical collar 47, and between the flange 36 and the lip portion 26 by a further cylindrical collar 48, the various parts being sealed with sealing rings 49 so that the vacuum in the vacuum chamber space 33 is effectively preserved.

In this way the refrigerator is mounted so as to minimise the effects of vibration from the refrigerator on the helium vessel, which might cause degradation of the 'Nuclear Magnetic Resonance' (NMR) image, and on the vacuum chamber, which might cause undesirable acoustic noise. This manner is similar to that described in aforementioned European patent EP260036.

In order to facilitate filling of the helium vessel 31 by means of a syphon tube (not shown but which is well known to those skilled in the art) a syphon guide tube 50 (FIG. 4) is provided which projects into the helium vessel 31 via the top plate 24 and the flanges 36 and 39 so as to provide access for the helium filling syphon tube as and when required, the guide tube 50 being sealed at an end thereof which projects from the turret 20 by means of a closure cap 51.

It will be appreciated that good thermal contact is required between the first and second stages 22 and 23 of the refrigerator and the flange plates 36 and 39 respectively. In order to facilitate this and to take up any tolerances, the second stage 23 of the refrigerator is arranged to be spring loaded by means of a spring 52 against the flange plate 39. The manner in which the refrigerator 21 together with the refrigerator stages 22 and 23 and the top plate 24 are removable from the turret is most clearly shown in the part exploded view, FIG. 3.

Figure 2:
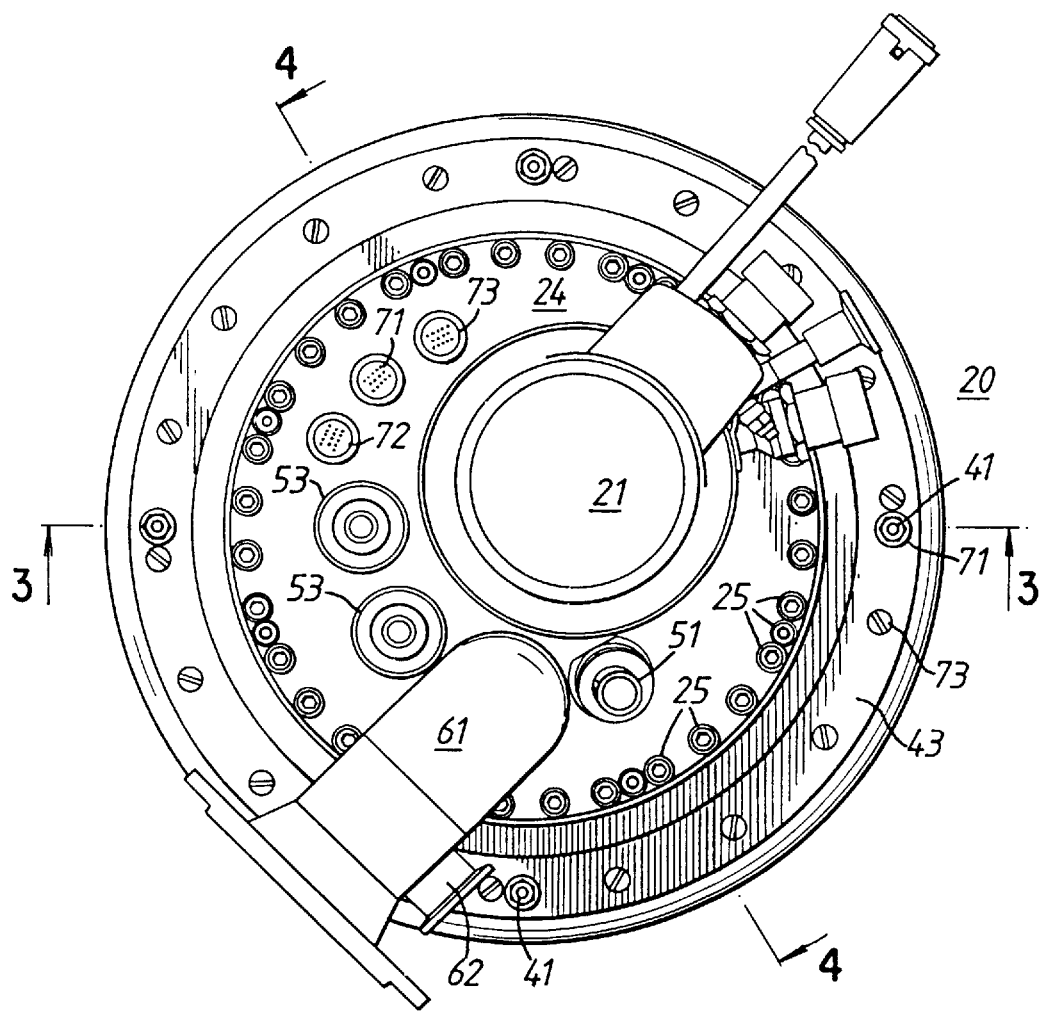
FIG. 2 is a plan view of the turret of a single turret super-conducting electro-magnet.

As shown in FIG. 3 and FIG. 2, two connector terminals 53 for making positive and negative connections respectively to the magnet winding (not shown) are supported by the top plate 24. The terminal 53 as shown in FIG. 3 communicates with a connector comprising a connector pin 54 and a connector socket 55 via sealed insulating connector terminal 'lead-throughs' 53a. The connector socket 55 is arranged to abut an insulative support plate 56, which supports a hollow conductor 57 which is largely metallic but may comprise a high temperature super-conducting element. The hollow conductor 57 is coupled at an end thereof 58 to the magnet winding (not shown) and at the opposite end thereof 59 to a link plate 60 by means of which it is electrically connected to the socket 55. The connection of the hollow conductor 57 at the end 58 may be made with a flexible link to accommodate relevant movement and prevent vibration. Since the tubular conductor 57 is hollow it is effectively helium gas cooled by helium gas which passes there-through to vent via a vent housing 61 shown in FIG. 2 which is supported on the top plate 24. The vent housing 61 is provided with an outlet manifold 62 to which a vent pipe may be coupled so that helium gas which escapes therefrom can be collected as required. As shown most clearly in FIG. 5 the tubular conductor 57 is supported by the flange plates 36 and 39 through which it is arranged to pass. In order to facilitate rigid fixing of the tubular conductor 57 it is provided with flanges 63 and 64 which are clamped to electrical isolating bushes 65 and 66 respectively mounted in the flange plates 36 and 39 respectively. Clamping of the shoulders 63 and 64 is effected by means of clamping rings 67 and 68 respectively and bolts 69 only two of which are shown. In order to facilitate the provision of good thermal contact and to take up tolerances as necessary Indium spacer rings 70 are optionally placed between the shoulders 63, 64 and the bushes 65, 66 as shown most clearly in FIG. 5.

As can be seen from FIG. 2 a pair of terminals 53 are provided each of which communicates with a hollow conductor for positive and negative poles respectively of the magnet. Additionally, electrical service connections 71, 72 and 73 are provided which are coupled via a loom not shown which passes through the turret to communicate as necessary with the windings. The necessity for service connections is well understood by those skilled in the art and further detailed explanation herein is believed to be unnecessary.

The provision of a single service turret accommodating a refrigerator, the necessary electrical connections and a syphon for topping up the helium vessel, simplifies construction considerably and reduces construction costs. Furthermore the provision of an arrangement wherein the refrigerator can simply be removed together with the electrical terminals considerably simplifies servicing procedures.

Additionally the provision of fixed current leads simplifies the operation of current injection into the windings.

It will be appreciated by those versed in the art that although the present embodiment includes tubular conductors, other forms of conductor, for example thin foils, which may be contained in a cooled conduit, might be used without departing from the scope of the invention.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

We claim:

1. A super-conducting electro-magnet for use in an MRI system comprising:
    a cryogenic containment vessel within which magnet windings are positioned;
    a vacuum chamber within which the cryogenic containment vessel is housed;
    at least one thermal shield positioned between the cryogenic containment vessel and the vacuum chamber in spaced apart relationship; and
    a single service turret which includes a refrigerator thermally coupled to the said at least one shield for cooling purposes, a tube which extends through said single service turret from the windings to facilitate filling of the cryogenic containment vessel with liquid coolant, and conductors which permanently extend through said single service turret from the magnet windings to facilitate current injection to the magnet windings, said conductors being thermally coupled to said refrigerator to effect cooling of said conductors, and being electrically isolated therefrom.

2. A super-conducting electro-magnet as claimed in claim 1, wherein there is provided in spaced apart relationship, two thermal shields positioned one within the other, the refrigerator having two stages a first stage of which is thermally coupled to an outer of the two thermal shields and a cooler second stage of which is thermally coupled to an inner of the two thermal shields, the two stages being in a helium environment.

3. A super-conducting electro-magnet a claimed in claim 2, wherein the two thermal shields are coupled to respective refrigerator stages via flexible thermal links and a pair of generally annular flanges arranged in spaced apart relationship to support respective stages co-axially within the single service turret.

4. A super-conducting electro-magnet as claimed in claim 1, wherein the conductors comprise two conductors for positive and negative winding connections respectively via which conductors the helium vessel is vented so that the conductors are effectively cryogenic containment gas cooled.

5. A super-conducting electro-magnet as claimed in claim 4, wherein a part of each conductor is a high temperature super-conductor.

6. A super-conducting electro-magnet as claimed in claim 4, wherein the conductors are arranged to project in thermal contiguity through the flanges but so as to be electrically isolated therefrom.

7. A super-conducting electro-magnet as claimed in claim 6, wherein the conductors are each provided with shoulders which are clamped against respective insulative bushes retained within the flanges by means of retaining clamps which are bolted to the flanges with the shoulders and bushes sandwiched there-between.

8. A super-conducting electro-magnet as claimed in claim 7, wherein the bushes are fabricated from anodised aluminium so that oxide anodisation provides the required insulation.

9. A super-conducting electro-magnet as claimed in claim 8, wherein the bush of at least one flange is spaced apart from a shoulder against which it is clamped by means of a deformable Indium spacer washer.

10. A super-conducting electro-magnet as claimed in claim 4 wherein the conductors are provided at an end thereof remote from the magnet windings with demountable terminal means supported in a turret top plate.

11. A super-conducting electro-magnet as claimed in claim 10 wherein the terminal means comprises insulated 'lead throughs' for terminal conductors, which 'lead throughs' are sealed to prevent air from entering the single service turret.

12. A super-conducting electro-magnet as claimed claim 1, wherein a generally annular space surrounding the refrigerator and a space within the single service turret connecting to the cryogenic containment vessel are fully or partially filled with thermally insulating material.

13. A super-conducting electro-magnet as claimed in claim 1 wherein the conductors are tubular.

14. A super-conducting electro-magnet as claimed in claim 1, wherein the vacuum chamber is coupled to the single service turret by a flexible bellows.

15. A super-conducting electro-magnet as claimed in claim 1, wherein the cryogenic containment vessel is coupled to the service turret by a flexible bellows.

16. A super-conducting electro-magnet as claimed in claim 1, wherein the single service turret is supported on the vacuum chamber by spring means.

17. An MRI system including a super-conducting electro-magnet as claimed in claim 1.

18. A super-conducting electro-magnet as claimed in claim 1, wherein said conductors are further cooled during operation by vapor cooling means.

19. A super-conducting electro-magnet for use in an MRI system, comprising:

a cryogenic containment vessel;

a vacuum chamber containing said cryogenic containment vessel;

at least one thermal shield positioned between the cryogenic containment vessel and a wall of said vacuum chamber;

a refrigeration unit thermally coupled to said at least one thermal shield;

a guide tube which extends from an exterior of said vacuum chamber to an interior of said cryogenic containment vessel for filling said cryogenic containment vessel with cooling fluid;

conductors which extend from an exterior of said vacuum chamber and electrically connect with the magnet windings; and a single service turret arranged on an exterior of said vacuum chamber;

wherein said refrigeration unit, said guide tube and said conductors are all accommodated within the single service turret.

* * * * *